US 6,591,987 B2

(12) United States Patent
Wu et al.

(10) Patent No.: US 6,591,987 B2
(45) Date of Patent: Jul. 15, 2003

(54) WAFER RETAINER

(75) Inventors: Tzong-Ming Wu, Taipei (TW); Chih-Lun Hsieh, Changhua Hsien (TW); Tien-Lu Ho, Ta Li (TW)

(73) Assignee: Industrial Technology Research Institute, Hsinchu (TW)

( * ) Notice: Subject to any disclaimer, the term of this patent is extended or adjusted under 35 U.S.C. 154(b) by 98 days.

(21) Appl. No.: 09/987,313

(22) Filed: Nov. 14, 2001

(65) Prior Publication Data

US 2003/0047476 A1 Mar. 13, 2003

(30) Foreign Application Priority Data

Sep. 12, 2001 (TW) ........................... 90215657 U

(51) Int. Cl.[7] ................ B65D 85/48; B65D 85/90
(52) U.S. Cl. .............. 206/454; 206/711; 206/445; 414/217
(58) Field of Search ............... 206/710, 725, 206/722, 711, 832, 445, 454, 833; 211/41.18; 118/500; 414/937, 217, 217.1

(56) References Cited

U.S. PATENT DOCUMENTS

| | | | | |
|---|---|---|---|---|
| 523,755 A | * | 7/1894 | Maenke | 312/234.5 |
| 4,880,116 A | * | 11/1989 | Kos | 206/454 |
| 5,452,795 A | * | 9/1995 | Gallagher et al. | 206/711 |
| 5,711,427 A | * | 1/1998 | Nyseth | 206/710 |
| H1762 H | * | 12/1998 | Kaempf et al. | 206/710 |
| 5,957,292 A | * | 9/1999 | Mikkelsen et al. | 206/710 |
| 6,082,540 A | | 7/2000 | Krampotich et al. | |
| 6,267,245 B1 | * | 7/2001 | Bores et al. | 206/711 |

FOREIGN PATENT DOCUMENTS

GB  2290414 A  * 12/1995  ........... B65D/85/30

* cited by examiner

Primary Examiner—J. Mohandesi
(74) Attorney, Agent, or Firm—Rabin & Berdo, P.C.

(57) ABSTRACT

A wafer retainer is disclosed to be fastened to the inner surface of the door panel of a wafer carrier without making openings in the inner surface of the door panel, the wafer retainer having at least one frame bar, retaining portions and positioning elements respectively extended from the at least one frame bar for fastening to respective locating elements at the inner surface of the door panel and retaining portions at the lateral sidewall of a recessed area, and a plurality of spring arms respectively extended from the at least one frame bar at different elevations and adapted to hold a corresponding storage wafer in the wafer carrier, each spring arm having a smoothly arched top end adapted to contact one point of the corresponding storage wafer to minimize friction.

10 Claims, 7 Drawing Sheets

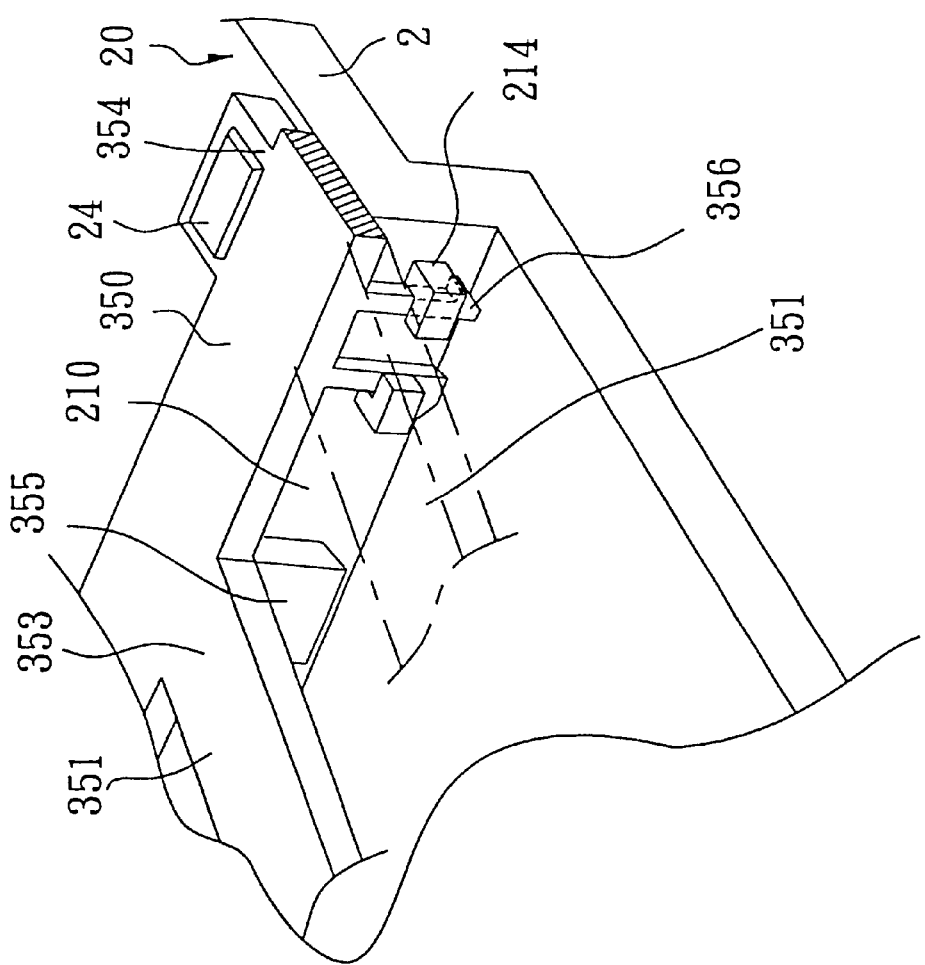
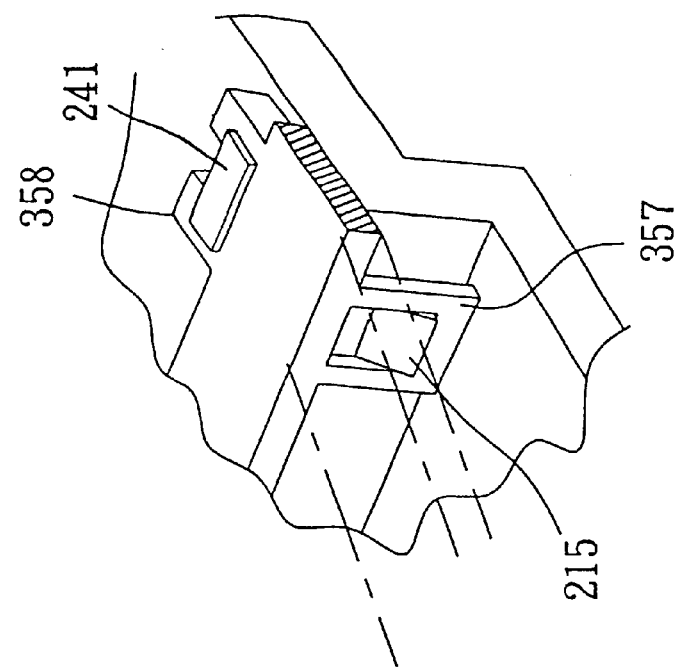
Fig. 4
Fig. 5

WAFER RETAINER

BACKGROUND OF THE INVENTION

1. Field of the Invention

The present invention relates to a wafer retainer and, more specifically, to such a wafer retainer to be used in a wafer carrier to retain storage wafers in position.

2. Description of Related Art

A wafer carrier is adapted to transfer wafers between a stoker and a load port, or to temporarily hold wafers in a stocker. U.S. Pat. No. 6,082,540 discloses a wafer carrier having two retainers installed in two rows of openings in the inner surface of the door panel thereof so that spring arms of the retainer hold individual wafers in position against vibration during transfer.

Because two rows of openings must be made in the inner surface of the door panel and the retainers must be provided with plug pins and O-rings for positioning in the openings, the fabrication and installation of the wafer carrier are complicated. The openings in the inner surface of the door panel may cause the air leak problem of wafer carrier and cause a barrier to the procedure of cleaning and drying the wafer carrier. Furthermore, the spring arms are unstable since there is only the plane frame base itself against the torque of the corresponding storage wafers. Because the frame base of the wafer retainer is not well supported at two corners of the inner surface, the holding down pressure from the spring arms is not evenly applied to the corresponding storage wafers. Further, because the spring arms are alternatively stopped at the storage wafers at one contact point of the left or right side, the storage wafers tend to be tilted. There is another known design, which uses two contact points to hold down each storage wafer. However, the two contact points increase the chance of friction, resulting in the formation of particles that will contaminate the storage wafers.

Therefore, it is desirable to provide a wafer retainer for wafer carrier that eliminates the aforesaid drawbacks.

SUMMARY OF THE INVENTION

The main object of the present invention is to provide a wafer retainer, which can easily be installed in the inner surface of the door panel of a wafer carrier without making openings in the inner surface of the door panel so that the wafer carrier is maintained in an airtight status when the door panel closed, and the door panel is easily cleaned and dried. It is another object of the present invention to provide a wafer retainer, which keeps the spring arms to hold the corresponding storage wafers stably in the wafer carrier so that the service life of the spring arms is greatly prolonged. It is still another object of the present invention to provide a wafer retainer, which enables the holding down pressure to be evenly distributed from the spring arms to the corresponding storage wafers, so as to minimize the formation of friction between the spring arms and the corresponding storage wafers and to prevent the generation of particles, and to save the expensive material cost of the retainer. To achieve these and other objects of the present invention and according to one aspect of the present invention, the wafer retainer is installed in the inner surface of the door panel of a wafer carrier. The door panel has a recessed area in the inner surface, one lateral sidewall at one side of the recessed area, at least one retaining portion at the lateral sidewall of the recessed area, and at least one locating element at the inner surface adjacent to the lateral sidewall of the recessed area. The wafer retainer comprises a frame bar, a plurality of spring arms respectively inwardly extended from the frame bar, the spring arms each having a top end and a bottom end, at least one retaining portion respectively extended from the frame bar and adapted to engage the at least one locating element of the inner surface of the door panel, and at least one positioning element respectively downwardly extended from the frame bar and adapted to engage the at least one retaining portion at the lateral sidewall of the recessed area of the door panel. Because the wafer retainer can be positively secured to the inner surface of the door panel without making openings in the inner surface of the door panel, the wafer carrier is maintained in an airtight status after the door panel closed, and the door panel is easily cleaned and dried. According to another aspect of the present invention, another lateral sidewall is formed at the other side of the recessed area and at least one other locating element is provided at the inner surface of the door panel adjacent to an other lateral sidewall, and the wafer retainer has an other frame bar arranged in parallel to the frame bar, the other frame bar having a plurality of inwardly extended spring arms, the spring arms of the other frame bar each having a top end and a bottom end. The other frame bar is located on the at least one other locating element of inner surface of the door panel, and then the at least one retaining portion of the frame bar is located on the at least one locating element of the inner surface of the door panel to force the positioning element of the frame bar to be fastened to the respective retaining portion of the lateral sidewall of the recessed area. Because the spring arms are alternatively arranged at different elevations with the respective top ends aligned in a line, the size of the wafer retainer is minimized to diminish material consumption. According to still another aspect of the present invention, the spring arms each further comprise a protruded portion downwardly extended from the respective bottom end and stopped at the lateral sidewall of the recessed area of the door panel, so that the holding down pressure from each spring arm is evenly employed to the corresponding storage wafer because of a reverse torque from the protruded portion. According to still another aspect of the present invention, the top ends of the spring arms are aligned in a line corresponding to the centerline of the door panel, and respectively disposed in contact with a respective storage wafer at one contact point so as to prevent the wafer tilted and to minimize friction between the respective storage wafers and the respective spring arms.

Other objects, advantages, and novel features of the invention will become more apparent from the following detailed description when taken in conjunction with the accompanying drawings.

BRIEF DESCRIPTION OF THE DRAWINGS

FIG. 4 is a perspective view of a part of the first embodiment of the present invention.

FIG. 5 is a perspective view showing the engagement between an alternate form of positioning element of the wafer retainer and an alternate form of the retaining portion of the door panel, and the engagement between an alternate form of the retaining portion of the wafer retainer and an alternate form of the locating element of the door panel.

DETAILED DESCRIPTION OF THE PREFERRED EMBODIMENT

Figure 1:
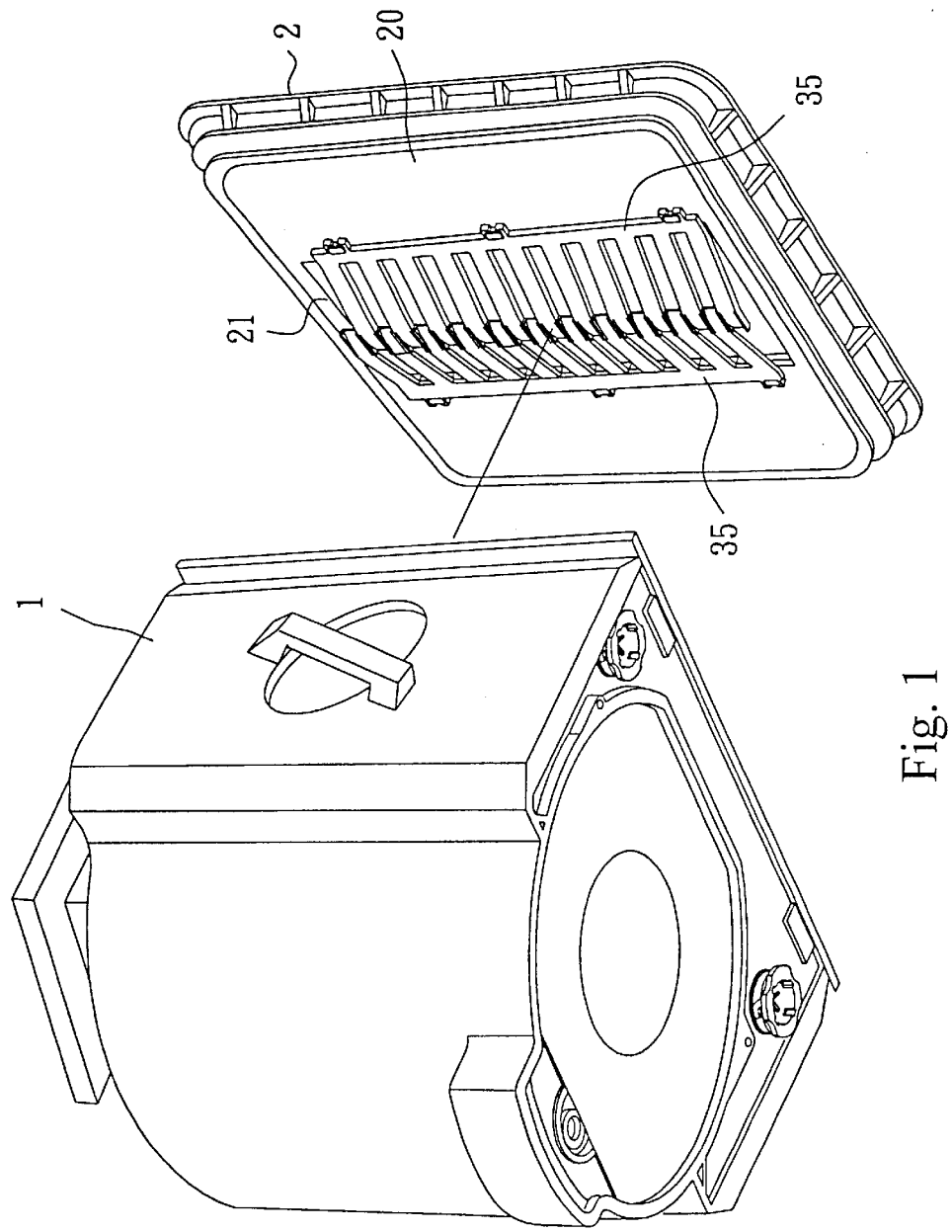
FIG. 1 depicts a perspective view of a wafer carrier constructed according to a first embodiment of the present invention.

With reference to FIG. 1, two identical wafer retainers 35 are arranged on the inner surface 20 of the door panel 2 of a wafer carrier 1 in reversed direction.

Figure 2:
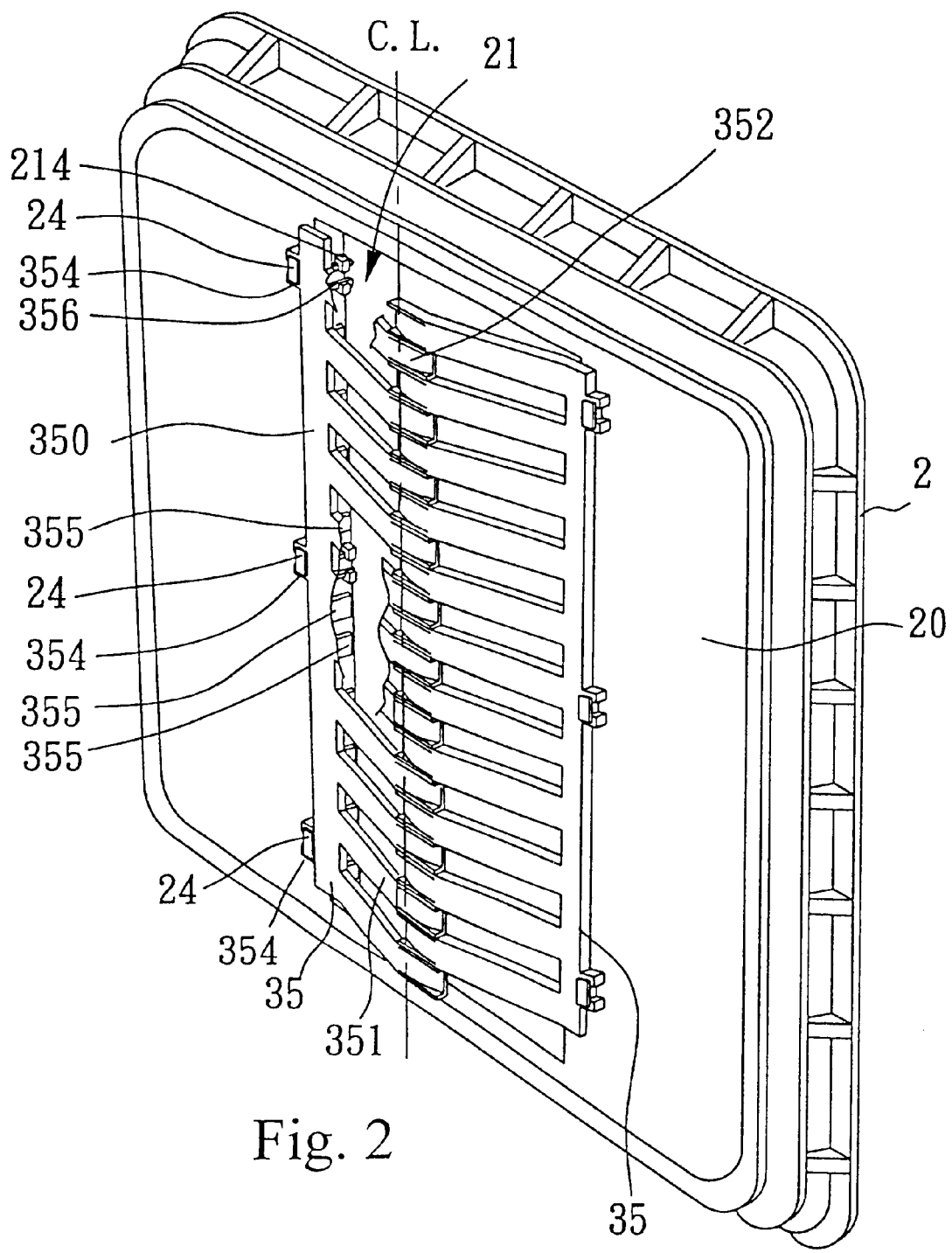
FIG. 2 is an enlarged view showing two wafer retainers constructed according to the first embodiment of the present invention and installed in the inner surface of the door panel.
Figure 3:
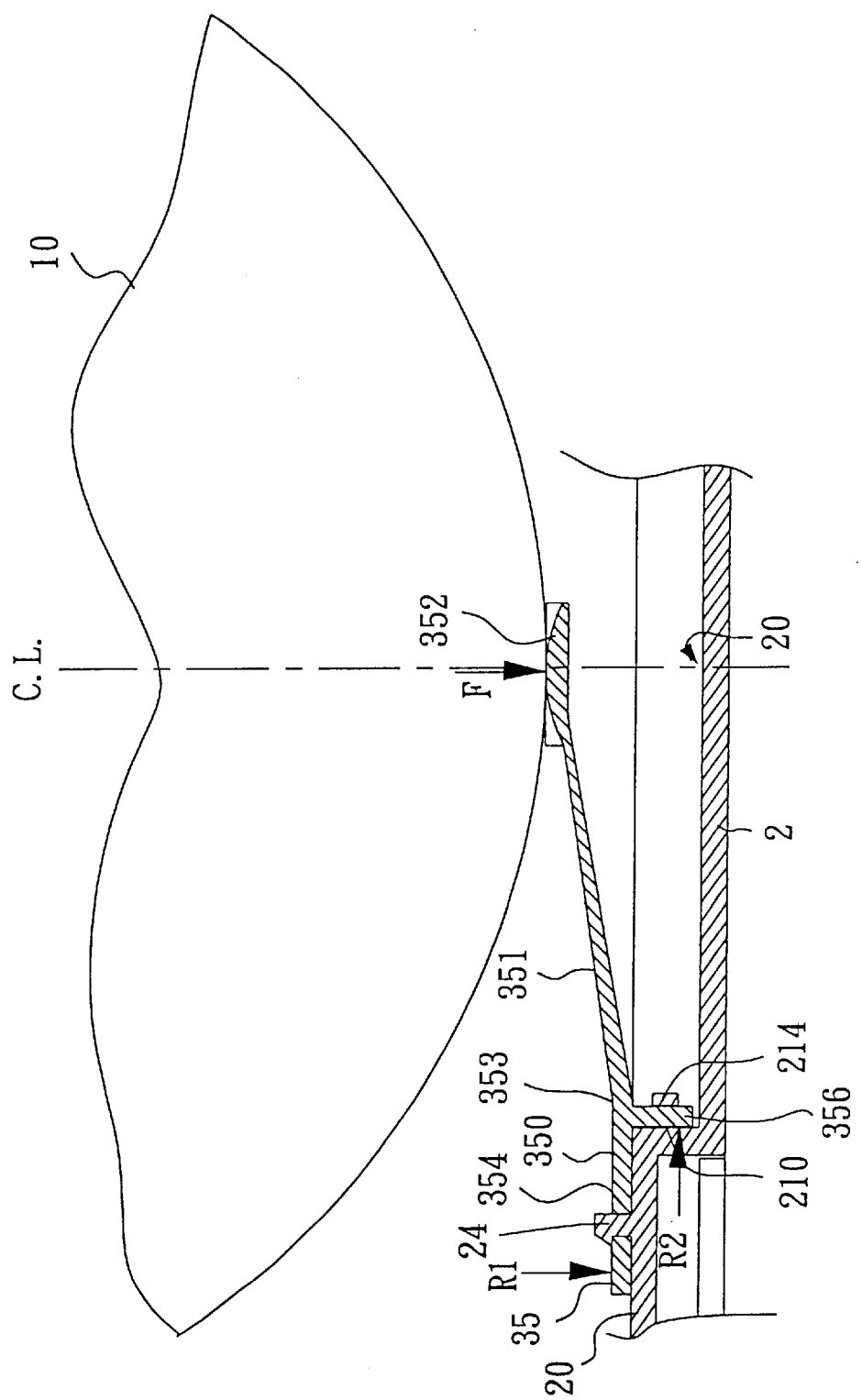
FIG. 3 is a sectional view of a part of the first embodiment of the present invention.
Figure 6:
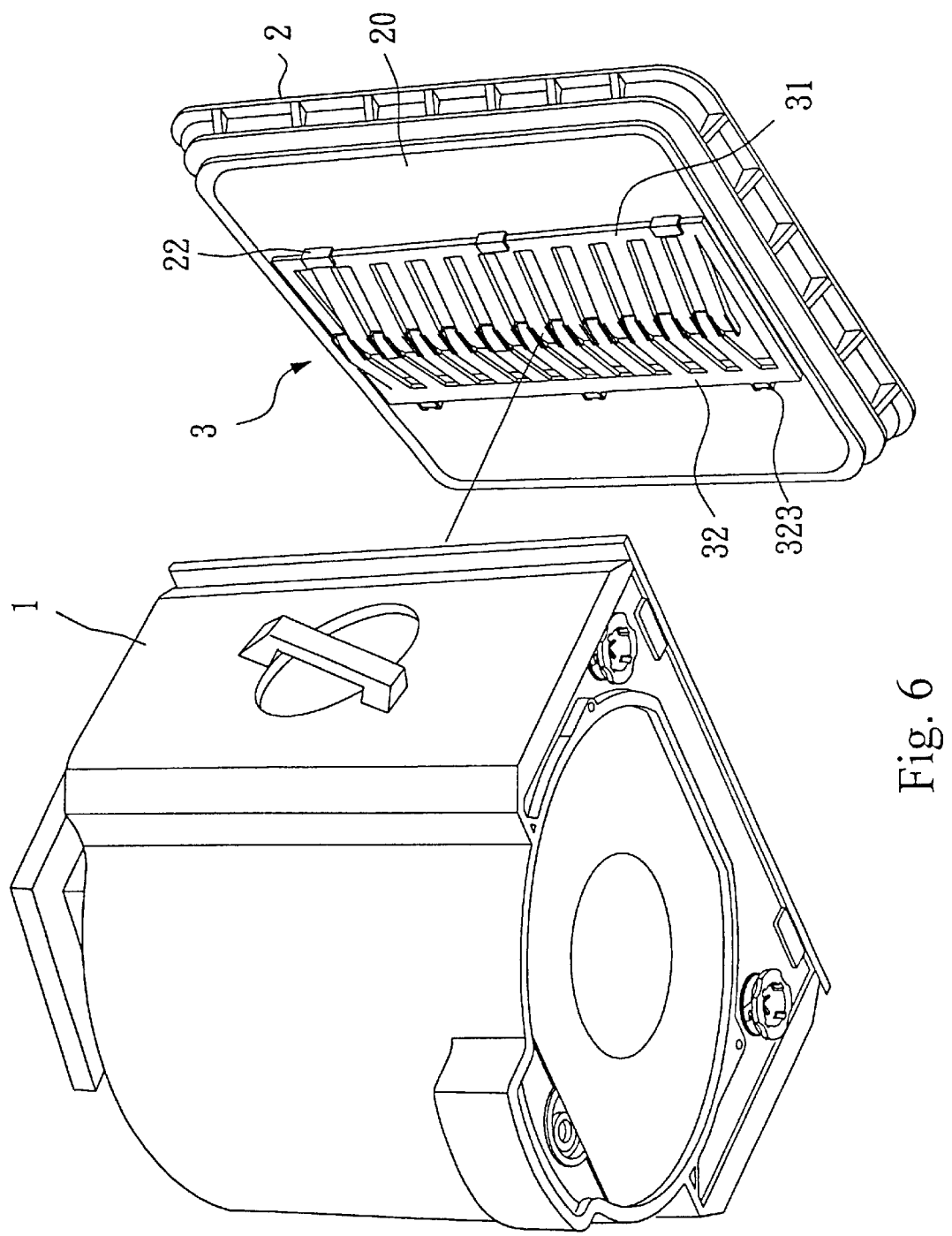
FIG. 6 depicts a perspective view of a wafer carrier constructed according to a second embodiment of the present invention.

Referring to FIGS. 2 and 3, the door panel 2 has a recessed area 21 in the inner surface 20, three retaining portions 214 protruded from one lateral sidewall 210 of the recessed area 21, and three locating elements 24 respectively disposed in the inner surface 20 adjacent to the lateral sidewall 210. Each wafer retainer 35 comprises a frame bar 350, and a plurality of spring arms 351 upwardly inwardly extended from one lateral side of the frame bar 350 at different elevations. Each spring arm 351 has a top end 352, and a bottom end 353. The frame bar 350 comprises three retaining portions 354 corresponding to the locating elements 24 of the door panel 2, and three downwardly extended positioning elements 356 corresponding to the retaining portions 214 of the door panel 2.

Referring to FIG. 4, during installation, the three retaining portions 354 of the frame bar 350 are respectively sleeved onto the locating elements 24 of the door panel 2 and then the three positioning elements 356 of the frame bar 350 are respectively forced into engagement with the retaining portions 214. Thus, each wafer retainer 35 is fixedly secured to the inner surface 20 of the door panel 2. This wafer retainer mounting design eliminates the procedure of making openings in the inner surface 20 of the door panel 2. Therefore, the wafer carrier 1 is maintained in an airtight status when the door panel 2 closed, and the door panel 2 can easily be cleaned and dried during a maintenance work.

Referring to FIGS. 3 and 4 again, the spring arm 351 has a protruded portion 355 downwardly extended from the bottom end 353. The protruded portion 355 is stopped at the lateral sidewall 210 of the recessed area 21 of the door panel 2 to produce an reactive force R2, which sets off the torque been applied by the corresponding wafer 10 to the top end 352 of the spring arm 351. Therefore, the spring arm 351 imparts an additional holding down pressure to the corresponding wafer 10, increasing the service life of the spring arms 351.

Referring to FIG. 3 again, the top end 352 of the spring arm 351 extends to the centerline of the door panel 2, so that the holding down pressure from the spring arm 351 is evenly applied to the center of the wafer 10, preventing the wafer 10 tilted. Further, the top end 352 of the spring arm 351 has a smoothly arched outer surface disposed in contact with the wafer 10 at one contact point, reducing the formation of friction between the spring arm 351 and the wafer 10 and preventing the production of particles.

FIG. 5 shows the engagement between an alternate form of positioning element 357 and an alternate form of retaining portion 215, and the engagement between an alternate form of retaining portion 358 and an alternate form of locating element 241. The engagement between the positioning element of the frame bar and the retaining portion of the lateral sidewall, and the engagement between the retaining portion of the frame bar and the locating element of the inner surface may be variously embodied, for example, snap, tongue and groove joint, dovetailed joint, hook joint, or any of a variety of conventional connecting or positioning designs may be employed.

FIGS. from 6 through 8 show an alternate form of the present invention. According to this embodiment, the door panel 2 of the wafer carrier 1 comprises three retaining portions 213 at the second lateral sidewall 212 of the recessed area 21 and three locating elements 23 at the inner surface 20 adjacent to the second lateral sidewall 212, and three L-shaped locating elements 22 in the inner surface 20 adjacent to the first lateral sidewall 211 of the recessed area 21. The wafer retainer 3 comprises a hollow frame base 30. The hollow frame base 30 comprises a first frame bar 31 and a second frame bar 32 bilaterally arranged in parallel, and a plurality of spring arms 310 and 320 respectively inwardly extended from the frame bars 31 and 32 at different elevations. The second frame bar 32 comprises three retaining portions 323, and three downwardly extended positioning elements 324. Each spring arm 310 or 320 has a top end 311 or 321, and a bottom end 312 or 322. The spring arms 310 and 320 are alternatively arranged at different elevations, keeping the respective top ends 311 and 321 aligned in a line corresponding to the centerline of the door panel 2. The spring arms 320 at the locations exclusive the positioning elements 324 of second frame bar 32 each have a protruded portion 325 downwardly extended from the respective bottom end 322 and stopped at the second lateral sidewall 212 of the recessed area 21 of the door panel 2. The spring arms 310 at the first frame bar 31 each have a protruded portion 315 downwardly extended from the respective bottom end 312 and stopped at the first lateral sidewall 211 of the recessed area 21 of the door panel 2.

Figure 8:
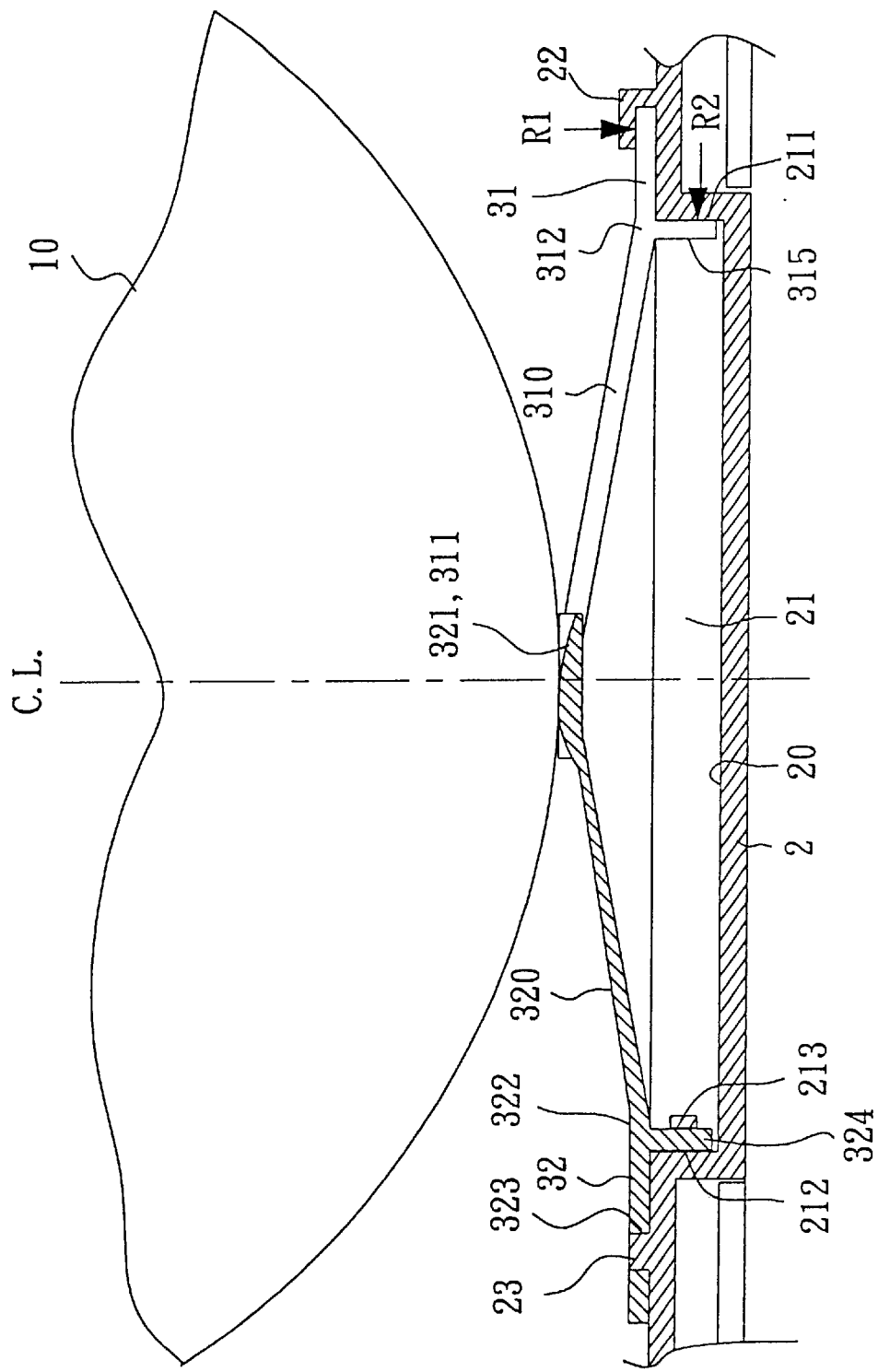
FIG. 8 is a sectional view of a part of the second embodiment of the present invention.

Referring to FIG. 8 again, during installation, the first frame bar 31 is inserted into the L-shaped locating elements 22 at the inner surface 20 of the door panel 2, and then the retaining portions 323 at the second frame bar 32 are respective sleeved onto the locating elements 23 at the inner surface 20 of the door panel 2, and then the positioning elements 324 at the second frame bar 32 are respectively forced into engagement with the retaining portions 213 at the second lateral sidewall 212 of the recessed area 21 of the door panel 2, keeping the wafer retainer 3 firmly secured to the inner surface 20 of the door panel 2. Because the inner surface 20 of the door panel 2 has no openings, the wafer carrier is maintained in an airtight status when the door panel closed, and the door panel can easily be cleaned and dried during a maintenance work.

Referring to FIG. 8 again, because the protruded portion 315 is stopped at the first lateral sidewall 211 of the recessed area 21 of the door panel 2, it produces a reactive force R2, which works with the reactive force R1 from the locating elements 22 to set off the torque been applied by the corresponding wafer 10 to the top end 311 of the spring arm 310. The protruded portion 325 of the spring arm 320 achieves the same effect.

Referring to FIG. 7 again, the spring arms 310 and 320 are alternatively arranged at different elevations, keeping the respective top ends 311 and 321 aligned in a line corresponding to the centerline of the door panel 2 and in contact with the corresponding storage wafers 10 at one contact point of the center of the wafer 10, so that storage wafers 10 are stably supported in position against tilting, preventing the formation of friction and generation of particles. Further, the top end 311 or 321 of the spring arm 310 or 320 can be made having a smoothly arched outer surface disposed in contact with the corresponding storage wafer 10 at a limited point to minimize friction between the respective spring arm 310 or 320 and the corresponding storage wafer 10.

Figure 7:
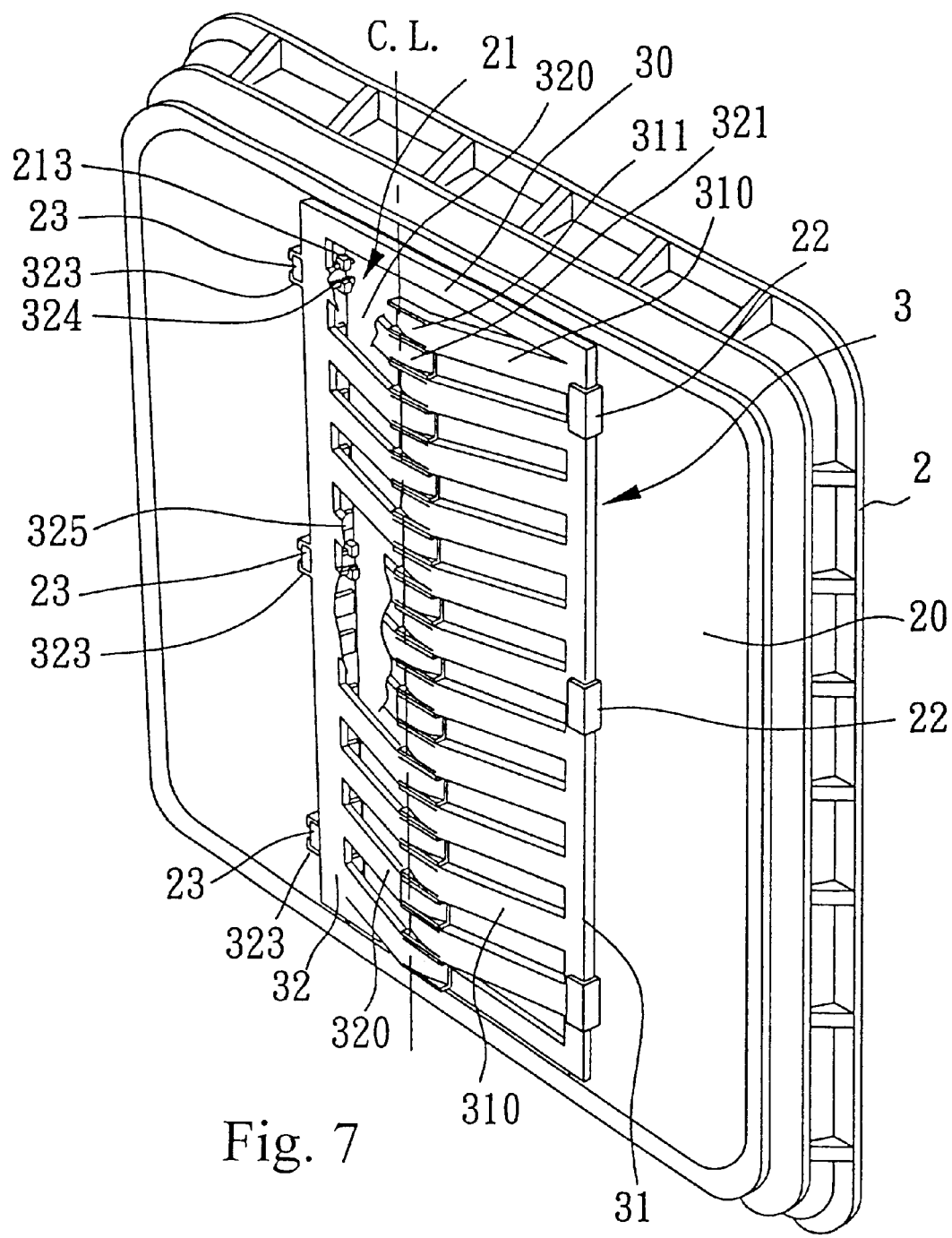
FIG. 7 is an enlarged view showing a wafer retainer constructed according to the second embodiment of the present invention and installed in the inner surface of the door panel.

According to the embodiment shown in FIG. 7, the spring arms 310 and 320 are alternatively arranged at two sides at different elevations, so that the first and second frame bars 31 and 32 are set closer to the centerline of the door panel 2. This design minimizes the dimension of the retainer 3 and diminishes the consumption of material that is expensive.

Further, the engagement between the positioning elements of the spring arms at the first frame bar and the retaining portions of the door panel may be variously embodied, for example, snap, tongue and groove joint, dovetailed joint, hook joint, or any of a variety of conventional connecting or positioning designs may be employed.

Although the present invention has been explained in relation to its preferred embodiments, it is to be understood that many other possible modifications and variations can be made without departing from the spirit and scope of the invention as hereinafter claimed.

What is claimed is:

1. A wafer retainer installed in the inner surface of a door panel of a wafer carrier, said door panel having a recessed area in said inner surface, at least one retaining portion at one lateral sidewall of said recessed area, and at least one locating element at said inner surface adjacent to the lateral sidewall of said recessed area, said wafer retainer comprising:

a frame bar, said frame bar having a plurality of inwardly extended spring arms, said spring arms each having a top end and a bottom end, at least one retaining portion respectively extended from said frame bar and adapted to engage the at least one locating element of the inner surface of said door panel, and at least one positioning element respectively downwardly extended from said frame bar and adapted to engage the at least one retaining portion at the lateral sidewall of said recessed area of said door panel.

2. The wafer retainer as claimed in claim 1 wherein said spring arms each further comprise a protruded portion downwardly extended from the respective bottom end and stopped at the lateral sidewall of said recessed area of said door panel.

3. The wafer retainer as claimed in claim 1, wherein said recessed area of said door panel has two lateral sidewalls at two opposite lateral sides thereof and at least one retaining portion at each of the two lateral sidewalls, and at least one locating element at said inner surface adjacent to each of the lateral sidewalls of said recessed area, for enabling two pieces of said wafer retainer to be invertedly fixedly fastened to the inner surface of said door panel.

4. The wafer retainer as claimed in claim 1, wherein the top end of each of said spring arms extends to the centerline of said door panel.

5. The wafer retainer as claimed in claim 1, wherein the top end of each of said spring arms has a smoothly arched outer surface adapted to support one wafer in said wafer carrier.

6. A wafer retainer installed in the inner surface of a door panel of a wafer carrier, said door panel having a recessed area in said inner surface, said recessed area having a first lateral sidewall and a second lateral sidewall, said second lateral sidewall having at least one retaining portion, the inner surface of said door panel having at least one first locating element adjacent to said first lateral sidewall, and at least one second locating element adjacent to said second lateral sidewall, said wafer retainer comprising:

a frame base, said frame base having a first frame bar and a second frame bar disposed at two opposite lateral sides thereof, said first frame bar and said second frame bar each having a plurality of inwardly extended spring arms, said spring arms each having a top end and a bottom end, said second frame bar having at least one retaining portion, and at least one downwardly extended positioning element;

said first frame bar and said second frame bar being respectively located on the at least one first locating element and the at least one second locating element of the inner surface of said door panel at two sides of said recessed area, and the at least one positioning element of said second frame bar being respectively fastened to the at least one retaining portion of said second lateral sidewall, keeping said wafer retainer fixedly secured to the inner surface of said wafer retainer.

7. The wafer retainer as claimed in claim 6 wherein the spring arms of said first frame bar each further comprise a protruded portion downwardly extended from the respective bottom end and stopped at the first lateral sidewall of said recessed area of said door panel.

8. The wafer retainer as claimed in claim 6, wherein the spring arms of said second frame bar each further comprise a protruded portion downwardly extended from the respective bottom end and stopped at the second lateral sidewall of said recessed area of said door panel.

9. The wafer retainer as claimed in claim 6, wherein the spring arms of said first frame bar and the spring arms of said second frame bar are alternatively arranged at different elevations, and the top end of each of the spring arms of said first frame bar and said second frame bar extends to the centerline of said door panel.

10. The wafer retainer as claimed in claim 6, wherein the top end of each of the spring arms of said first frame bar and said second frame bar has a smoothly arched outer surface adapted to support one wafer in said wafer carrier.

* * * * *